United States Patent
Lindow et al.

(10) Patent No.: US 8,377,802 B2
(45) Date of Patent: Feb. 19, 2013

(54) III-V SEMICONDUCTOR STRUCTURES AND METHODS FOR FORMING THE SAME

(75) Inventors: Ed Lindow, Scottsdale, AZ (US); Chantal Arena, Mesa, AZ (US); Ronald Bertram, Mesa, AZ (US); Ranjan Datta, Bangalore (IN); Subhash Mahajan, Tempe, AZ (US)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 13/069,900

(22) Filed: Mar. 23, 2011

(65) Prior Publication Data

US 2011/0284863 A1   Nov. 24, 2011

Related U.S. Application Data

(60) Provisional application No. 61/318,693, filed on Mar. 29, 2010.

(51) Int. Cl.
*H01L 21/20* (2006.01)
(52) U.S. Cl. ............ 438/478; 438/22; 438/483; 438/46; 438/481
(58) Field of Classification Search .................. 438/478, 438/22, 483, 46, 481
See application file for complete search history.

(56) References Cited

U.S. PATENT DOCUMENTS

| | | | |
|---|---|---|---|
| 6,440,823 B1 | 8/2002 | Vaudo et al. | |
| 2008/0153191 A1 | 6/2008 | Grillot et al. | |
| 2009/0258452 A1 | 10/2009 | Enya et al. | |

OTHER PUBLICATIONS

Holec et al., Critical Thickness Calculations for InGaN/GaN, Journal of Crystal Growth, vol. 303, No. 1, Apr. 10, 2007, pp. 314-317.
International Search Report for International Application No. PCT/US2011/029589 mailed May 10, 2011, 4 pages.
International Written Opinion for International Application No. PCT/US2011/029589 mailed May 10, 2011, 10 pages.
Pereira et al , Strain and Composition Distributions in Wurtzite InGaN/GaN Layers Extracted From X Ray Reciprocal Space Mapping, Applied Physics Letters, vol. 80, issue No. 21, p. 3913 (2002).
Pereira et al ,Structural and Optical Properties of inGaN/GaN Layers Close to the critical Layer Thickness, Applied Physics Letters, vol. 81, No. 7, Aug. 12, 2002, pp. 1207-1209.
Parker et al, Determination of the critical layer thickness in the InGa/GaN heterostructures, Applied Physics Letters, vol. 75 No. 18, p. 2776 (Nov. 1999).
Leyer et al., The critical thickness of InGaN on (0001) GaN, Journal of Crystal Growth, vol. 310, p. 4913 (2008).
Ye et al., Equilibrium critical thickness for a wurtzite InGaN/GaN heterostructure, Superlattices and Microstructures (2010).
Zhao et al, Theoretical study on critical thicknesses of InGaN grown on (0001) GaN, Journal of Crystal Growth, vol. 327, p. 202 (2011).
International Preliminary Report on Patentability for International Application No. PCT/US2011/029589 dated Oct. 2, 2012, 9 pages.

*Primary Examiner* — Long Pham
(74) *Attorney, Agent, or Firm* — TraskBritt

(57) ABSTRACT

Embodiments of the invention relate to methods of fabricating semiconductor structures, and to semiconductor structures fabricated by such methods. In some embodiments, the methods may be used to fabricate semiconductor structures of III-V materials, such as InGaN. A semiconductor layer is fabricated by growing sublayers using differing sets of growth conditions to improve the homogeneity of the resulting layer, to improve a surface roughness of the resulting layer, and/or to enable the layer to be grown to an increased thickness without the onset of strain relaxation.

13 Claims, 5 Drawing Sheets

III-V SEMICONDUCTOR STRUCTURES AND METHODS FOR FORMING THE SAME

CROSS-REFERENCE TO RELATED APPLICATION

This application claims the benefit of U.S. Provisional Patent Application Ser. No. 61/318,693, filed Mar. 29, 2010, the disclosure of which is hereby incorporated herein in its entirety by this reference.

TECHNICAL FIELD

Embodiments of the present invention generally relate to III-V semiconductor structures and methods of forming III-V semiconductor structures.

BACKGROUND

III-V semiconductor materials, such as, for example, III-arsenides (e.g., Indium Gallium Arsenide (InGaAs)), III-phosphides (e.g., Indium Gallium Phosphide (InGaP)) and III-nitrides (e.g., Indium Gallium Nitride (InGaN)), may be employed in a number of electronic device structures, such as, for example, switching structures (e.g., transistors, etc.), light-emitting structures (e.g., laser diodes, light-emitting diodes, etc.), light-receiving structures (e.g., waveguides, splitters, mixers, photodiodes, solar cells, solar subcells etc.), and/or microelectromechanical system structures (e.g., accelerometers, pressure sensors, etc). Such electronic device structures containing III-V semiconductor materials may be used in a wide variety of applications. For example, such device structures are often used to produce radiation (e.g., visible light) at one or more of various wavelengths. The light emitted by such structures may be utilized not only for illumination applications, but may also be used in, for example, media storage and retrieval applications, printing applications, spectroscopy applications, biological agent detection applications, and image projection applications.

In greater detail, the InGaN layer may initially grow "pseudomorphically" to the underlying substrate, such that a lattice parameter of the InGaN layer is caused (e.g., forced by atomic forces) to substantially match a lattice parameter of the underlying substrate upon which it is grown. The lattice mismatch between the InGaN layer and the underling substrate (e.g., GaN) may induce strain in the crystal lattice of the InGaN layer, and this induced strain may increase with increasing thickness of the InGaN layer. As the thickness of the InGaN layer increases with continued growth thereof, the strain in the InGaN layer may increase until, at a thickness commonly referred to as the "critical thickness," the InGaN layer may no longer grow in a pseudomorphic manner and may undergo strain relaxation. Strain relaxation in the InGaN layer may result in a deterioration of quality in the crystal lattice of the InGaN layer. For example, such deterioration in crystal quality in the InGaN layer may include the formation of crystalline defects (e.g., dislocations), a roughening of an InGaN layer surface, and/or the formation of regions of inhomogeneous material composition.

In addition, upon the onset of strain relaxation, the InGaN layer may incorporate an increased amount of indium. In other words, under constant growth conditions, the percentage of indium incorporated into the InGaN layer at the growth surface thereof may increase, resulting in a non-uniform concentration of indium in the InGaN layer across the thickness thereof. In addition, an increase in indium concentration in the InGaN layer may promote the onset of additional strain relaxation, which may result in a further deterioration in crystal quality of the InGaN layer.

BRIEF SUMMARY

The various embodiments of the present invention generally relate to III-V semiconductor structures and methods for forming such III-V semiconductor structures. For example, in some embodiments, the present invention includes indium gallium nitride (InGaN) structures and methods of forming InGaN structures.

This summary is provided to introduce a selection of concepts in a simplified form that, which concepts are further described in the detailed description below of some example embodiments of the invention. This summary is not intended to identify key features or essential features of the claimed subject matter, nor is it intended to be used to limit the scope of the claimed subject matter.

In some embodiments, the present invention includes methods of forming a semiconductor structure comprising a III-V semiconductor layer. A III-V semiconductor layer may be grown by growing a first III-V semiconductor sublayer using a first set of growth conditions, and growing at least a second III-V semiconductor sublayer over the first III-V semiconductor sublayer using a second set of growth conditions different from the first set of growth conditions, the first III-V semiconductor sublayer and the at least a second III-V semiconductor sublayer forming the III-V semiconductor layer. The III-V semiconductor layer may be formed to have an average total thickness greater than a critical thickness of the first III-V semiconductor layer and less than a critical thickness of the second III-V semiconductor sublayer. The first set of growth conditions and the second set of growth conditions may be selected such that a net rate of incorporation of a group III element into a growth surface of the first III-V semiconductor sublayer is at least substantially equal to a net rate of incorporation of the group III element into a growth surface of the at least a second III-V semiconductor sublayer, such that a composition of the III-V semiconductor layer is at least substantially constant across the average total thickness of the III-V semiconductor layer.

In additional embodiments, the present invention includes methods of growing an indium gallium nitride (InGaN) layer. A first InGaN sublayer may be grown utilizing a first set of growth conditions to a first thickness less than or equal to a critical thickness of the first InGaN sublayer. A second InGaN sublayer may be grown utilizing a different, second set of growth conditions such that an average thickness of the InGaN layer is greater than the critical thickness of the first InGaN sublayer and less than or equal to a critical thickness of the second InGaN sublayer. The different, second set of growth conditions may be selected to comprise at least one of a decreased flow rate of an indium precursor relative to a flow rate of the indium precursor in the first set of growth conditions, and an increased reactor growth temperature relative to the a reactor growth temperature in the first set of growth conditions, such that a concentration of indium in the InGaN layer is at least substantially constant across the average thickness of the InGaN layer.

The various embodiments of the invention may also include structures formed by the methods described herein. For example, in yet further embodiments, the present invention includes Indium Gallium Nitride (InGaN) layers that include a first InGaN sublayer and at least a second InGaN sublayer disposed over the first InGaN sublayer. A total thickness of the InGaN layer equals a sum of a thickness of the first InGaN sublayer and a thickness of the at least a second InGaN sublayer, and the total thickness of the InGaN layer is greater than a critical thickness of the first InGaN sublayer and less than a critical thickness of the at least a second InGaN sublayer.

As another example, additional embodiments of the invention include Indium Gallium Nitride (InGaN) layers that include a first InGaN sublayer having a thickness less than or equal to a critical thickness of the first InGaN sublayer, and a second InGaN sublayer disposed upon the first InGaN sublayer. The thickness of the InGaN layer is greater than a critical thickness of the first InGaN sublayer, and a thickness of the second InGaN sublayer is less than or equal to a critical thickness of the second InGaN sublayer. A concentration of indium in the first InGaN sublayer is at least substantially equal to a concentration of indium in the second InGaN sublayer.

Further aspects, details, and alternate combinations of the elements of embodiments of the invention will be apparent from the following detailed description.

BRIEF DESCRIPTION OF THE DRAWINGS

The present invention may be understood more fully by reference to the following detailed description of example embodiments of the present invention, which are illustrated in the appended figures in which.

DETAILED DESCRIPTION

Figure 1A:
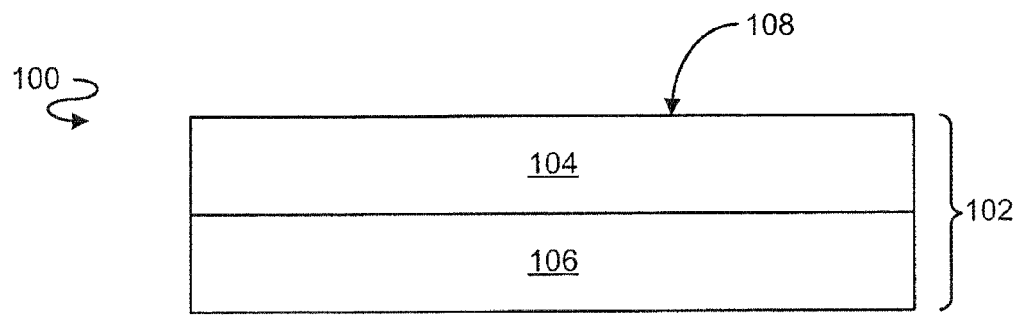
FIGS. 1A-1C schematically illustrate embodiments of the invention that may be used to grow an InGaN layer comprising a number of InGaN sublayers.

The illustrations presented herein are not meant to be actual views of any particular material, device, or method, but are merely idealized representations that are employed to describe embodiments of the present invention.

Headings are used herein for clarity only and without any intended limitation. A number of references are cited herein, and the disclosures of which are incorporated herein, in their entirety, by this reference for all purposes. Further, none of the cited references, regardless of how characterized herein, is admitted as prior art relative to the invention of the subject matter claim herein.

As used herein, the term "III-V semiconductor" means and includes any semiconductor material that is at least predominantly comprised of one or more elements from group IIIA of the periodic table (B, Al, Ga, In, and Ti) and one or more elements from group VA of the periodic table (N, P, As, Sb, and Bi).

As used herein, the terms "indium gallium nitride" and "InGaN" mean alloys of indium nitride (InN) and gallium nitride (GaN) having a composition of $In_xGa_{1-x}N$, where $0<x\leq1$.

As used herein, the term "sublayer" means a layer portion of a relatively larger single layer of material.

As used herein, the term "ultimate sublayer" means the sublayer most distal from a semiconductor substrate upon which a number of sublayers are deposited.

As used herein, the term "penultimate sublayer" means the sublayer adjacent to and underlying an ultimate sublayer of a plurality of sublayers.

As used herein, the term "critical thickness" means the average total thickness of a layer of semiconductor material at which and beyond which pseudomorphic growth discontinues and the layer undergoes strain relaxation.

As used herein, the term "growth surface" means any surface of a semiconductor substrate, layer or sublayer at which additional growth of the semiconductor substrate, layer or sublayer can be carried out.

As used herein, the term "substantially" is used herein to refer to a result that is complete except for any deficiencies normally expected in the art.

The embodiments of the invention may have applications to a wide range of III-V semiconductor materials. For example, the methods and structures of the embodiments of the invention may be applied to III-nitrides, III-arsenides, III-phosphides and III-antimonides, in binary, ternary, quaternary and quinary form. Particular applications pertain to growing group III-nitride semiconductors containing indium, such as indium gallium nitride (InGaN). Accordingly, for conciseness and convenience only and without limitation, the following description and figures reflect common characteristics of the III-nitrides, and particularly, of InGaN.

Experimentation in the III-nitride materials system demonstrates that InGaN layers grown heteroepitaxially to a thickness above a critical thickness, may undergo strain relaxation to relieve strain in the crystal lattice resulting from lattice mismatch. Upon the onset of strain relaxation in the InGaN layers, an increased amount of indium may be incorporated, which may result in a non-uniform concentration profile of indium across a thickness of the InGaN layers. For example, an InGaN layer may include an increased indium percentage proximate to a growth surface of the layer. Such a non-uniform indium composition in the InGaN layer may be undesirable for at least some applications.

Experimentation also demonstrates that the strain relaxation of the InGaN layer may also result in roughening of the growth surface of the InGaN layer. Such surface roughening may be detrimental to the production of semiconductor devices using the InGaN layer. Further, experimentation has demonstrated that strain relaxation of the InGaN layer may result in an increase in a density of defects in the crystalline material. Such defects may include, for example, dislocations and regions of inhomogeneous composition (i.e., phase separated regions).

Referring to FIG. 1A, a semiconductor structure 100 may be fabricated or otherwise provided to comprise a semiconductor substrate 102. Semiconductor substrate 102 may include a semiconductor material 104 that may be used as a seed layer for use in forming one or more additional sublayers of semiconductor material thereon as part of the fabrication of a III-V semiconductor layer, such as an InGaN layer, as described in further detail below.

As shown in FIG. 1A, the layer of semiconductor material 104 may be attached to and carried by a substrate 106. In some embodiments, however, the semiconductor material 104 may comprise a free-standing, bulk layer of semiconductor material that is not disposed on or carried by a substrate 106 or any other material.

In some embodiments, the layer of semiconductor material 104 may comprise an epitaxial layer of semiconductor material. By way of example and not limitation, the layer of semiconductor material 104 may comprise an epitaxial layer of III-V semiconductor material. For example, the layer of semiconductor material 104 may comprise an epitaxial layer of GaN or an epitaxial layer of InGaN.

Substrate 106 may comprise a material such as, for example, aluminum oxide ($Al_2O_3$) (e.g., sapphire), zinc oxide (ZnO), silicon (Si), silicon carbide (SiC), gallium arsenide (GaAs), lithium gallate ($LiGaO_2$), lithium aluminate ($LiAlO_2$), yttrium aluminum oxide ($Y_3Al_5O_{12}$), or magnesium oxide (MgO).

Optionally, one or more intermediate layers of material (not shown), such as another layer of semiconductor material, may be disposed between the layer of semiconductor material 104 and the substrate 106. Such intermediate layers of material may be used, for example, as a seed layer for forming the layer of semiconductor material 104 thereon, or as a bonding layer for bonding the layer of semiconductor material 104 to the substrate 106, such as might be carried out when it is difficult or impossible to form the layer of semiconductor material 104 directly on the substrate 106. In addition, bonding of the layer of semiconductor material 104 to the substrate 106 may be desired if semiconductor material 104 is polar. In such embodiments, the bonding process may be utilized to alter the polarity of the polar semiconductor material.

The figures herein are not drawn to scale, and, in actuality, the layer of semiconductor material 104 may be relatively thin compared to the substrate 106.

To form semiconductor structure 100 shown in FIG. 1A, the layer of semiconductor material 104 may be epitaxially grown or otherwise formed, or provided on a major surface of the substrate 106. Any of various methods known in the art may be used to reduce the density of dislocations in the layer of semiconductor material 104. Such methods include, for example, epitaxial lateral overgrowth (ELO), Pendeo epitaxy, in-situ masking techniques, etc. The layer of semiconductor material 104 may be deposited, for example, using a process such as metalorganic chemical vapor deposition (MOCVD), molecular beam epitaxy (MBE), or hydride vapor stage epitaxy (HYPE).

Figure 1B:
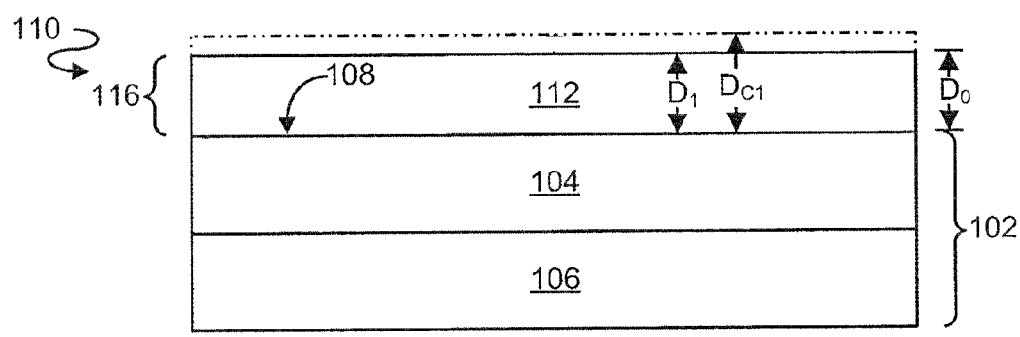

FIG. 1B illustrates semiconductor structure 110 comprising semiconductor substrate 102 and a III-V semiconductor layer 116 over the semiconductor material 104. As a non-limiting example, III-V semiconductor layer 116 may comprise an InGaN layer. III-V semiconductor layer 116 may be subdivided into a number of sublayers. For example, as shown in FIG. 1B, III-V semiconductor layer 116 may comprise an initial, first sublayer 112 disposed upon semiconductor substrate 102. First sublayer 112 may be grown to a first thickness ($D_1$) utilizing a first set of growth conditions.

In some embodiments of the invention, III-V semiconductor layer 116 may comprise two or more sublayers disposed one over another and grown utilizing two or more different sets of growth conditions. The average total thickness of the III-V semiconductor layer ($D_0$) may be equal to the sum of the thicknesses of the two or more sublayers. In other words, the sum of the thicknesses of all of the sublayers may equal the average total thickness of the III-V semiconductor layer ($D_0$). FIG. 1B illustrates an initial stage in the growth of III-V semiconductor layer 116, and, thus, illustrates only a portion of the III-V semiconductor layer 116 to be formed. The portion of the III-V semiconductor layer 116 shown in FIG. 1B comprises a first sublayer 112. Therefore, at the initial growth stage of the III-V semiconductor layer 116, the average total thickness of the III-V semiconductor layer ($D_0$) is equal to the average thickness ($D_1$) of the first sublayer 112.

In more detail, first sublayer 112 may be grown upon or at a growth surface 108 of semiconductor substrate 102 utilizing methods such as, for example, metalorganic chemical vapor deposition (MOCVD), molecular beam epitaxy (MBE), or hydride vapor stage epitaxy (HYPE). In some embodiments of the invention, semiconductor substrate 102 may include semiconductor material 104, which may have a lattice parameter mismatch with first sublayer 112. In other words, at least one lattice parameter of the semiconductor material 104 in a strain-relaxed state may differ from at least one lattice parameter of the first sublayer 112 in a strain-relaxed state. For example, in some embodiments of the invention, semiconductor material 104 may comprise a III-V semiconductor, such as, for example, GaN or alternatively InGaN with a different concentration of indium compared to that of first sublayer 112. Such a mismatch in lattice parameter between semiconductor material 104 and first sublayer 112 may result in lattice strain in first sublayer 112.

Lattice strain in first sublayer 112 may increase as the average total thickness ($D_0$) of III-V semiconductor layer 116 increases with continued growth. In some embodiments of methods of the invention, the average total thickness ($D_1$) of the first sublayer 112 may be selected to be less than or equal to a first critical thickness ($D_{C1}$) of the first sublayer 112.

The critical thickness of first sublayer 112 may be dependent on a number of parameters including, for example, the composition of first sublayer 112 (e.g., the percentage of indium in the first sublayer 112), the growth parameters utilized for the growth of first sublayer 112, and the degree of lattice mismatch between the first sublayer 112 and the underlying semiconductor layer 102 upon which first sublayer 112 is grown.

Further details relating to the critical thickness of III-V semiconductor layers, and particularly in InGaN layers, may be found in the journal publications of Pereira et al., *Applied Physics Letters*, vol. 81, issue no. 7, pp. 1207-1209 (2002), entitled "Structural and Optical Properties of InGaN/GaN Layers Close to the Critical Layer Thickness," Pereira et al., *Applied Physics Letters*, vol. 80, issue no. 21, p. 3913 (2002), entitled "Strain and Composition Distributions in Wurtzite InGaN/GaN Layers Extracted from X-Ray Reciprocal Space Mapping," and Holec et al., *Journal of Crystal Growth*, vol. 303, issue no. 1, pp. 314-317 (2007), entitled "Critical Thickness Calculations for InGaN/GaN."

As illustrated in FIG. 1B, first sublayer 112 may have an average total thickness ($D_1$) that is less than the first critical thickness ($D_{C1}$) of the first sublayer 112. However, if the thickness of the first sublayer 112 were increased beyond the initial critical thickness (i.e., $D_1 > D_{C1}$) while maintaining the initial, first set of growth conditions (which may be held constant while forming the first sublayer 112), the strain in first sublayer 112 may become sufficient to result in strain relaxation and the formation of defects in the first sublayer 112.

Figure 1C:
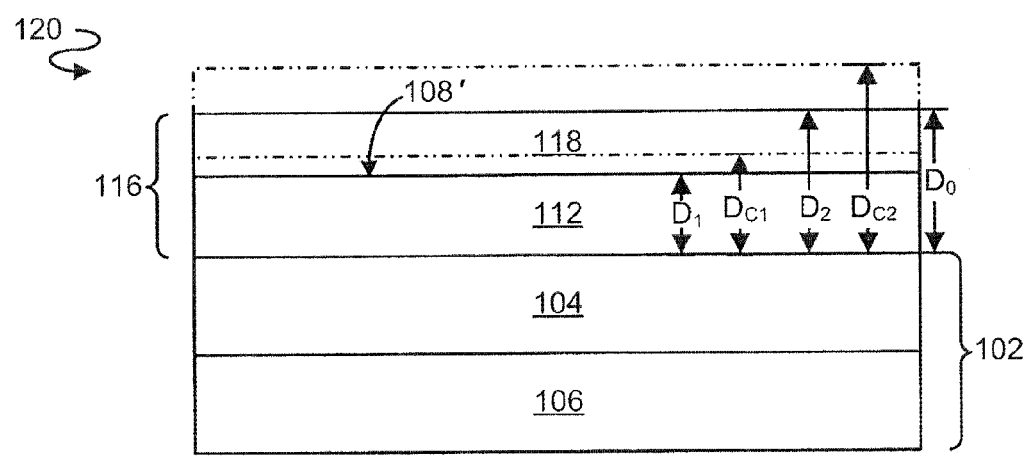

FIG. 1C illustrates semiconductor structure 120 that comprises semiconductor substrate 102 and III-V semiconductor layer 116. III-V semiconductor layer 116, which may be, for example, an InGaN layer as discussed above, may include first sublayer 112 and a following, second sublayer 118. Second sublayer 118 may be grown utilizing a second set of growth conditions that differs in at least one aspect from the first set of growth conditions used to form the first sublayer 112, and may be selected such that the average thickness ($D_2$)

of second sublayer 118 yields an average total thickness ($D_O$) of III-V semiconductor layer 116 greater than the initial critical thickness ($D_{C1}$) and less than or equal to a following, second critical thickness ($D_{C2}$) of the second sublayer 118 (and the InGaN layer 116).

In greater detail, second sublayer 118 may be grown upon growth surface 108' of first sublayer 112. Second sublayer 118 may be grown utilizing the growth techniques described above (e.g., MBE, MOCVD, or HYPE). The second sublayer 118 ($D_2$) may be grown to a thickness such that the average total thickness ($D_O$) of III-V semiconductor layer 116 increases and becomes greater than initial critical thickness ($D_{C1}$). The second set of growth conditions used to form the second sublayer 118 may be selected such that the III-V semiconductor layer 116 may be substantially prevented from strain relaxing as the average total thickness of ($D_O$) III-V semiconductor 116 increases beyond the first critical thickness ($D_{C1}$).

Lattice strain in second sublayer 118 may increase further as the average total thickness ($D_O$) of III-V semiconductor layer 116 increases with continued growth, utilizing the second set of growth conditions. In some embodiments of methods of the invention, the thickness ($D_2$) of second sublayer 118 may be selected such that the average total thickness ($D_O$) of III-V semiconductor layer 116 is less than or equal to a following, second critical thickness ($D_{C2}$) of the second sublayer 118 (and the III-V semiconductor layer 116).

As illustrated in FIG. 1C, III-V semiconductor layer 116 may have an average total thickness ($D_O$) that is greater than the initial, first critical thickness ($D_{C1}$) and less than the following, second critical thickness ($D_{C2}$). However, if the thickness of second sublayer 118 were increased such that the average total thickness ($D_O$) of III-V semiconductor layer 116 met or exceeded the second critical thickness while maintaining the second set of growth conditions, the lattice strain in the III-V semiconductor layer 116 would become sufficient to result in strain relaxation of the III-V semiconductor layer 116 and the formation of associated defects therein.

Second sublayer 118 may be grown utilizing a second set of growth conditions selected such that a net rate at which the group III element is incorporated into the second sublayer 118 as the second sublayer 118 is formed is substantially equal to a net rate at which the group III element is incorporated into the first sublayer 112 as the first sublayer 112 is formed using the first set of growth conditions. Therefore, embodiments of the invention may comprise methods to achieve a III-V semiconductor layer comprising a substantially uniform composition. The group III element may comprise one or more of indium, aluminum and gallium, and embodiments of the invention may provide a III-V semiconductor layer having an at least substantially constant concentration of the group III element across a thickness of the III-V semiconductor layer, and may provide a III-V semiconductor layer that is substantially free of strain relaxation and defects associated with such strain relaxation.

In more detail, the net rate at which the group III element is incorporated into a sublayer of a III-V semiconductor layer at a growth surface may be dependent on a number of factors including, for example, the incoming flux of the group III element to the growth surface, and the desorption flux of the group III element from the growth surface. Therefore, embodiments of the invention may include the regulation (e.g., selective control) of the incoming flux of the group III element to the growth surface, and/or the regulation (e.g., selective control) of the desorption flux of the group III element from the growth surface in order to maintain the net rate at which the group III element is incorporated into the III-V semiconductor layer at a growth surface as the average total thickness ($D_O$) of III-V semiconductor layer 116 increases.

In some embodiments of the invention, selecting the second set of growth conditions may comprise reducing an incoming flux of the group III element to growth surface 108' during formation of the second sublayer 118, relative to an incoming flux of the group III element to growth surface 108' during formation of the first sublayer 112. Not to be limited by theory, but reducing the incoming flux of the group III element to the growth surface may affect the number of the group III elemental species available for interaction. By reducing the incoming flux of the group III element to growth surface of the III-V semiconductor layer 116, the rate at which the group III element is incorporated into the growing III-V semiconductor layer 116 may be maintained at least substantially constant as the average total thickness ($D_O$) of the III-V semiconductor layer increases.

Reducing the incoming flux of the group III element to growth surface 108' may further comprise, for example, one or more of reducing a partial pressure of a group III element precursor within a reactor in which the III-V semiconductor layer 116 is formed, reducing a reactor pressure within the reactor, reducing the group III element precursor flow rate through the reactor, reducing a ratio of the group III element precursor to an alkyl within the reactor, increasing a group-V precursor flow rate through the reactor, and increasing an inert gas flow rate through the reactor. Such methods for reducing an incoming flux of the group III element are known in the field of physical chemistry, and further details regarding such methods may be found in a number of reference publications including, for example, the publication of R. I. Masel, 1996, entitled "Principles of Adsorption and Reaction on Solid Surfaces," John Wiley & Sons, the publication of P. Atkins, 1998, entitled "Physical Chemistry," Oxford University Press, the publication of I. N. Levine, entitled "Physical Chemistry," 1995, McGraw-Hill, Inc., and the publication of R. B. Bird et al., entitled "Transport Phenomena," 1960, John Wiley & Sons.

The following non-limiting example embodiments of the invention describe methods for maintaining a substantially constant rate of incorporation of the group III element into the III-V semiconductor layer at the growth surface thereof. For conciseness and convenience only, and without limitation, the following description and figures pertain to a III-V semiconductor layer comprising InGaN and a group III-element comprising indium. It should be appreciated, however, that the following description may also be applicable to the range of III-V semiconductor materials and group III elements described above.

Figure 3A:
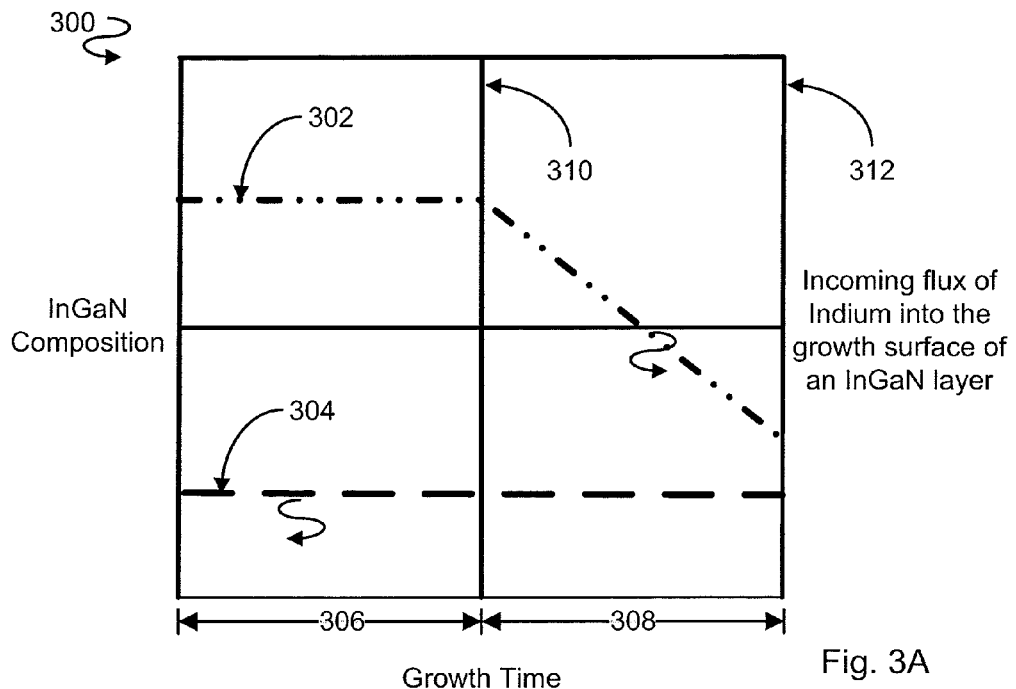
FIGS. 3A and 3B schematically illustrate an embodiment of the invention for growing an InGaN layer while varying an incoming flux of indium into a growth surface of an InGaN layer.

FIG. 3A illustrates a non-limiting example embodiment of some methods of the invention, which may be used for maintaining the rate of incorporation of the group III element indium into the growth surface of III-V semiconductor layer 116 by reducing the incoming flux of the indium into the growth surface. FIG. 3A includes a graph 300, which illustrates the relationship between growth time, InGaN composition and the incoming flux of indium to growth surface of the III-V semiconductor layer 116. Line 302 represents the variation in the incoming indium flux to the growth surface as a function of growth time, whereas line 304 represents the composition of the InGaN layer 116 at the growth surface as a function of growth time.

In greater detail, region 306 of graph 300 illustrates the growth period for the formation of the first sublayer 112 (e.g., initial InGaN sublayer) utilizing a first set of growth conditions. As illustrated in this non-limiting example, the incoming flux of indium to the growth surface may be constant over the period of growth used to form the first sublayer 112, and the composition at the growth surface of the first sublayer 112 may also be substantially constant during the growth of the first sublayer 112 such that the composition is at least substantially constant across a thickness of the first sublayer 112.

Region 308 of graph 300 illustrates the growth period for the formation of the second sublayer 118 (e.g., following InGaN sublayer) utilizing a second set of growth conditions differing from the first set of growth conditions used to form the first sublayer 112. As illustrated in this non-limiting example, the incoming flux of indium to growth surface 108' may be reduced at a desired reduction rate after the average total thickness of InGaN layer 116 reaches the initial critical thickness ($D_0$) at a time represented by line 310. However, as the incoming flux of indium to growth surface 108' of InGaN layer 116 decreases, the InGaN composition of the InGaN layer may remain substantially constant, as represented by line 304. The growth of second sublayer 118 continues as the incoming flux of indium to growth surface 108' of the InGaN layer decreases, at most until the InGaN layer thickness equals the following critical thickness ($D_0$) at a time represented by line 312, at which time the growth may be terminated.

As outlined above, in some embodiments of the invention, selecting the second set of growth conditions may comprise reducing an indium precursor flow rate to reduce the incoming flux of indium to the growth surface of the InGaN layer.

In greater detail, the flow of indium precursor to the growth surface of InGaN layer 116 may affect the incoming flux of indium species available for interaction on the growth surface of the InGaN layer. Therefore, by reducing the indium precursor flow rate, a corresponding reduction of incoming flux of indium species to the growth surface of InGaN layer 116 may be achieved, and the rate at which indium is incorporated into the InGaN layer 116 may be maintained at least substantially constant. In some embodiments, selecting a reduced indium precursor flow rate may comprise reducing an indium flow rate at a reduction rate of approximately 5 cc per minute or less, at a reduction rate of approximately 3 cc per minute or less, or even at a reduction rate of approximately than 1 cc per minute or less.

Figure 3B:
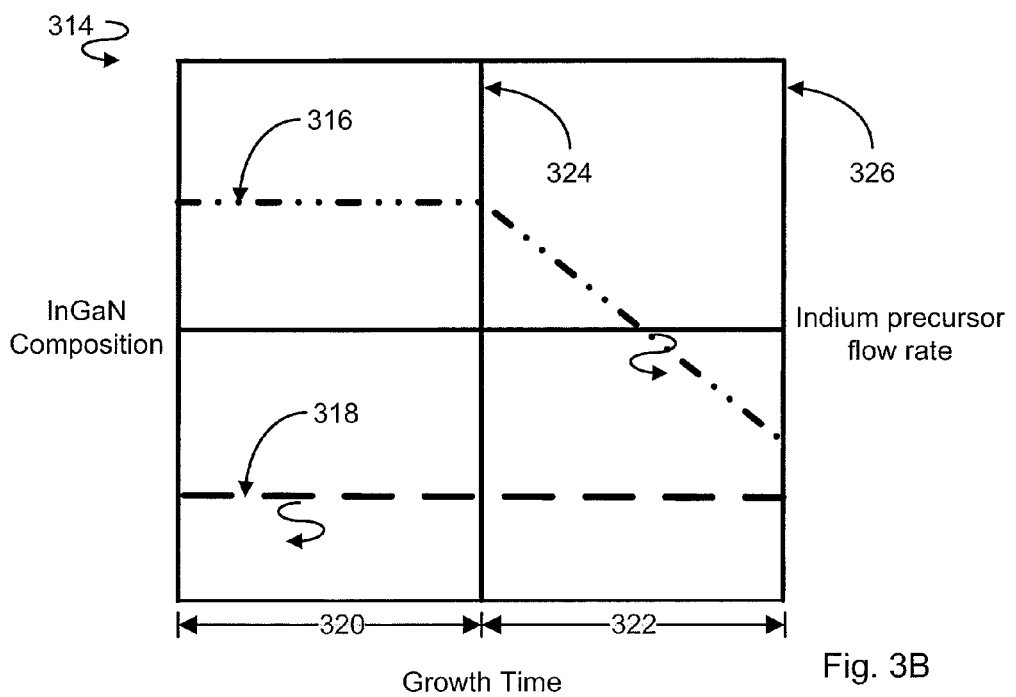

As a non-limiting example of some embodiments of the invention, FIG. 3B illustrates graph 314, which shows a relationship between growth time, InGaN composition, and the flow rate of the indium precursor. Line 316 represents the precursor flow rate as a function of growth time, and line 318 represents the composition of the InGaN layer 116 as a function of growth time of the InGaN layer 116.

In greater detail, region 320 of graph 314 illustrates a growth period used to form first sublayer 112 (e.g., the initial InGaN sublayer) utilizing a first set of growth conditions. The indium precursor flow rate 316 is constant over the period of growth 320 for forming first sublayer 112, and the InGaN composition is also substantially constant across a thickness of first sublayer 112.

Region 322 of graph 314 illustrates a growth period to form second sublayer 118 (e.g., following InGaN sublayer). As illustrated in this non-limiting example, the indium precursor flow rate 316 may be reduced at a selected reduction rate after the thickness of first sublayer 112 reaches the initial critical thickness ($D_{C1}$) at a time represented by line 324. However, as the indium precursor flow rate decreases, the InGaN composition of the InGaN layer may remain at least substantially constant, as represented by line 316. The growth of the second sublayer 118 may continue as the indium precursor flow rate decreases at most until the InGaN layer thickness reaches the second critical thickness ($D_0$) at a time represented by line 326, at which point the growth may be terminated.

The indium precursor for the formation of InGaN layer 116 may comprise, for example, trimethylindium (TMI) and/or triethylindium (TEI). The flow rate of the indium precursor for initial growth conditions may comprise, for example, a flow rate in a range extending from about 60 to about 100 cc per min. More particularly, the flow rate of the indium precursor during the second set of growth conditions may comprise, for example, a flow rate range extending from about 40 to about 80 cc per min. The reduction rate of the precursor flow rate during the second set of growth conditions may comprise, for example, a reduction rate in a range extending from about 0.5 to about 10 cc per minute, per minute.

In some embodiments of the invention, selecting the second set of growth conditions further comprises increasing a desorption flux of indium from the growth surface of the InGaN layer 116. Not to be limited by theory, but increasing the desorption flux of indium from the growth surface may prevent the InGaN layer from incorporating more indium as the average total thickness of the InGaN layer increases. Therefore, by increasing the desorption flux of indium from the growth surface 108', the net rate of indium incorporation into the growing surface of the InGaN layer 116 may be maintained at least substantially constant as the average total thickness of the InGaN layer 116 increases.

Increasing the desorption flux of indium from the growth surface 108' may further comprise, for example, one or more of increasing a substrate growth temperature, decreasing a reactor growth pressure, decreasing a diffusion boundary layer thickness, and increasing a substrate rotation speed (e.g., when utilizing a rotating disc type reactor (RDR)). These methods for reducing the incoming flux of indium are known in the field of physical chemistry, and further details can be found in the reference publications identified hereinabove.

Figure 4A:
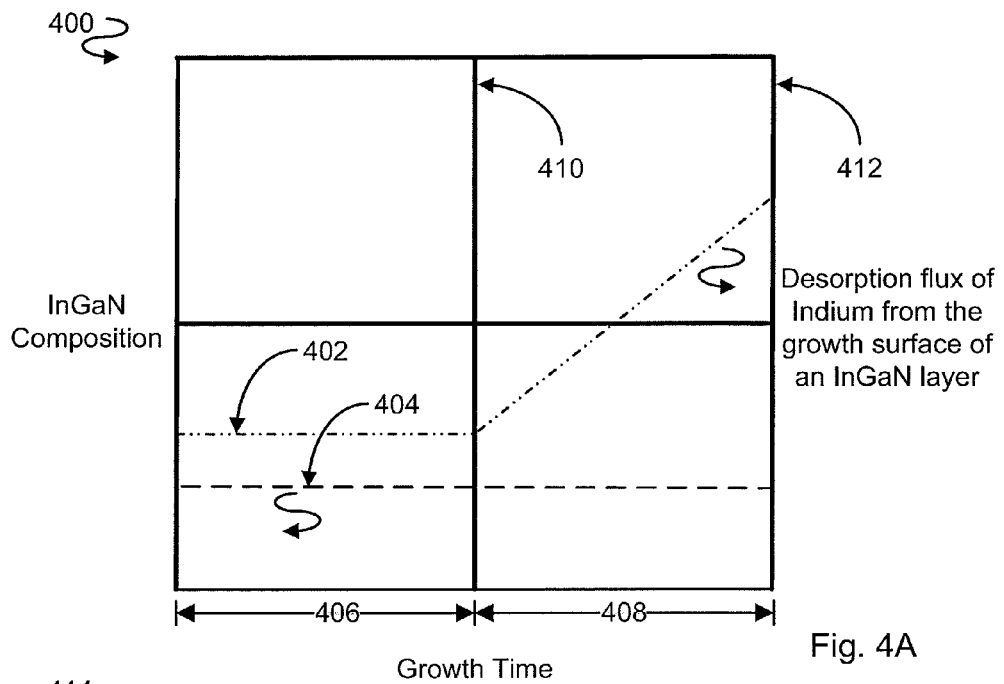
FIGS. 4A and 4B schematically illustrate an embodiment of the invention for growing an InGaN layer while varying a desorption flux of indium from a growth surface of an InGaN layer.

FIG. 4A illustrates a non-limiting example embodiment of some methods of the invention for maintaining the net rate of incorporation of indium into InGaN layer 116 at least substantially constant by increasing the desorption flux of indium from growth surface 108'. FIG. 4A comprises a graph 400, which illustrates a relationship between growth time, the InGaN composition, and the desorption flux of indium from growth surface 108'. Line 402 represents the indium desorption flux from the growth surface as a function of growth time, whereas line 404 represents the composition of the InGaN layer as a function of growth time.

In greater detail, region 406 of graph 400 illustrates a growth period used to form the first sublayer 112 (e.g., the initial InGaN sublayer) utilizing a first set of growth conditions. As illustrated in this non-limiting example, the desorption flux of indium from the growth surface may be constant during the period of growth used to form the first sublayer 112, and the InGaN composition may also be constant across a thickness of the first sublayer 112.

Region 408 of graph 400 illustrates the growth time used to form the second sublayer 118 (e.g., the following InGaN sublayer) utilizing a different, second set of growth conditions. As illustrated in this non-limiting example, the desorption flux of indium from a growth surface of the InGaN layer 116 increases at a selected incrementation rate after the average total thickness ($D_0$) of InGaN layer 116 reaches the first critical thickness ($D_{C1}$) at a time represented by line 410. However, as the desorption flux of indium from the growth surface of the InGaN layer 116 increases, the InGaN composition of the InGaN layer may remain at least substantially constant, as shown by line 404. The growth of the second sublayer 118 may continue as the desorption flux of indium from the growth surface of the InGaN layer increases at most until the average total InGaN layer thickness ($D_O$) equals the second critical thickness ($D_O$) at a time represented by line 412, at which time the growth may be terminated.

As outlined above, in some embodiments of the invention, selecting the second set of growth conditions may comprise increasing the substrate growth temperature to increase the desorption flux of indium from the growth surface of the InGaN layer 116.

In greater detail, increasing the substrate growth temperature may increase the desorption flux of indium from the growth surface of the InGaN layer 116. Therefore, by increasing the substrate growth temperature, a corresponding increase in the desorption flux of indium from the growth surface 108' may be achieved, and the rate of indium incorporation in the growing InGaN layer 116 may be maintained at least substantially constant as the thickness of the InGaN layer 116 increases. In some embodiments, selecting the second set of growth conditions such that the substrate growth temperature increases at a desired rate further comprises increasing the substrate growth temperature at an incrementation rate of approximately 0.5° C. per minute or less, by an incrementation rate of approximately 2° C. per minute or less, or even by an incrementation rate of approximately 10° C. per minute or less.

Figure 4B:
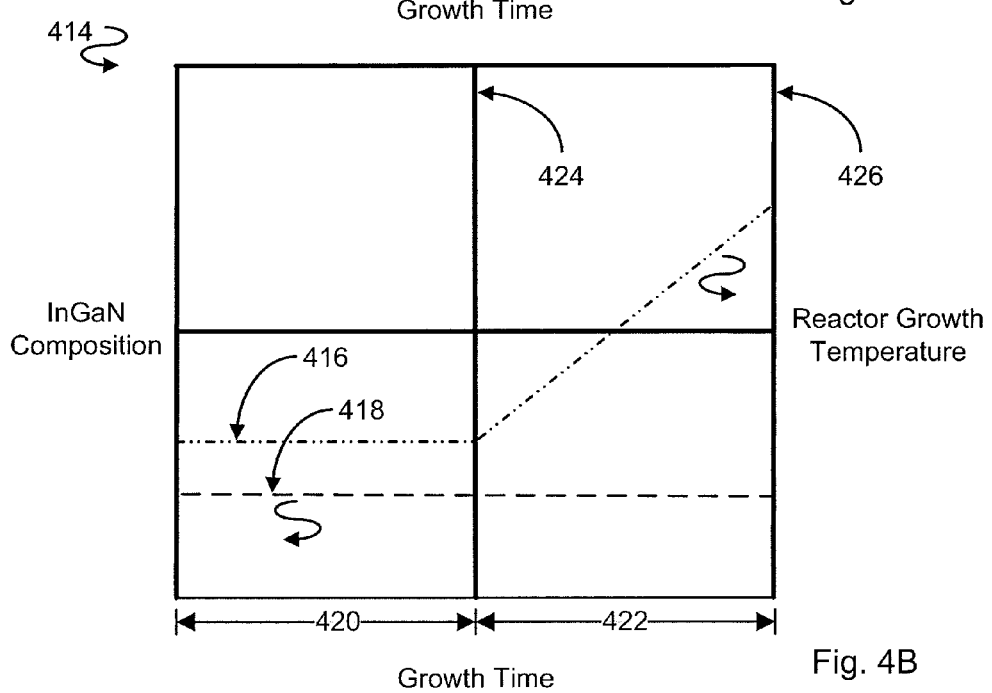

As a non-limiting example of some embodiments of the invention, FIG. 4B illustrates graph 414 showing a relationship between growth time, InGaN composition and the substrate growth temperature. Line 416 represents the substrate growth temperature as a function of growth time, whereas line 418 represents the composition of the InGaN layer as a function of growth time.

In greater detail, region 420 of graph 400 illustrates the growth period for the growth of first sublayer 112 utilizing the first set of growth conditions. The substrate growth temperature 416 is constant over period 420 of growth used to form the first sublayer 112, and the InGaN composition is also constant over the growth of first sublayer 112 utilizing the first set of growth conditions.

Region 422 of graph 400 illustrates the growth period for the growth of second sublayer 118 utilizing the different, second set of growth conditions. As illustrated in this non-limiting example, the substrate growth temperature 416 increases at a selected incrementation rate after the thickness of the first sublayer 112 reaches the initial critical thickness ($D_{C1}$) at a time represented by line 424. However, as the substrate growth temperature increases, the concentration of indium within the InGaN layer 116 may remain at least substantially constant, as shown by line 418. The growth of second sublayer 118 continues as the substrate temperature increases at most until the InGaN layer thickness ($D_O$) reaches the second critical thickness ($D_O$) at a time represented by line 426, at which point the growth may be terminated.

The substrate growth temperature during the first set of growth conditions may comprise, for example, a growth temperature of from about 750° C. to about 850° C. The substrate growth temperature during the second set of growth conditions may comprise, for example, a reactor growth temperature of from about 800° C. to about 900° C. The incrementation rate of the reactor growth temperature during the second set of growth conditions may comprise, for example, an incrementation rate of between about 0.5° C. and about 10° C. per minute, per minute.

In some embodiments of the invention, the III-V semiconductor layer 116 (e.g., a layer of InGaN) may be grown comprising an initial, first sublayer, a following, second sublayer, and one or more additional sublayers grown over the second sublayer. The one or more additional sublayers may be grown utilizing one or more additional growth conditions selected such that the composition of the III-V semiconductor layer 116 (e.g., an InGaN layer) is at least substantially constant across the III-V semiconductor layer 116, and such that the III-V semiconductor layer 116 is substantially free of strain relaxation.

More generally, embodiments of the invention for growing a III-V semiconductor layer may comprise growing two or more sublayers stacked one over another utilizing two or more different sets of growth conditions, wherein the average total thickness of the III-V semiconductor layer may equal the sum of the thicknesses of the two or more sublayers.

Figure 2A:
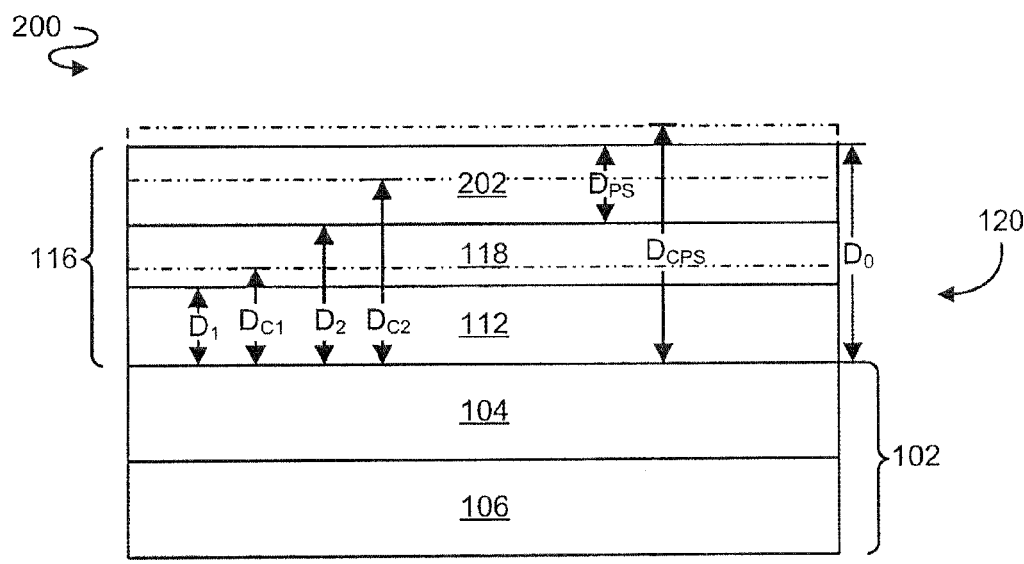
FIGS. 2A and 2B schematically illustrate further embodiments of the invention that may be used to grow an InGaN layer comprising a number of InGaN sublayers.

In greater detail, FIG. 2A illustrates semiconductor structure 200, which includes semiconductor structure 120 of FIG. 1C and an additional sublayer. The additional sublayer may comprise a penultimate sublayer 202.

Penultimate sublayer 202 may have a thickness ($D_{PS}$) such that the average total thickness ($D_O$) of the III-V semiconductor layer 116 is greater than the critical thickness of an adjacent underlying sublayer (e.g., sublayer 118 and/or sublayer 112). In this non-limiting example, the adjacent underlying sublayer comprises second sublayer 118, and the penultimate sublayer thickness ($D_{PS}$) yields an average total thickness ($D_O$) of III-V semiconductor layer 116 that is greater than the second sublayer critical thickness ($D_O$). In addition, penultimate sublayer 202 may have a thickness ($D_{PS}$) such that the average total thickness ($D_O$) of the III-V semiconductor layer 116 is less than or equal to penultimate sublayer critical thickness ($D_{CPS}$).

Figure 2B:
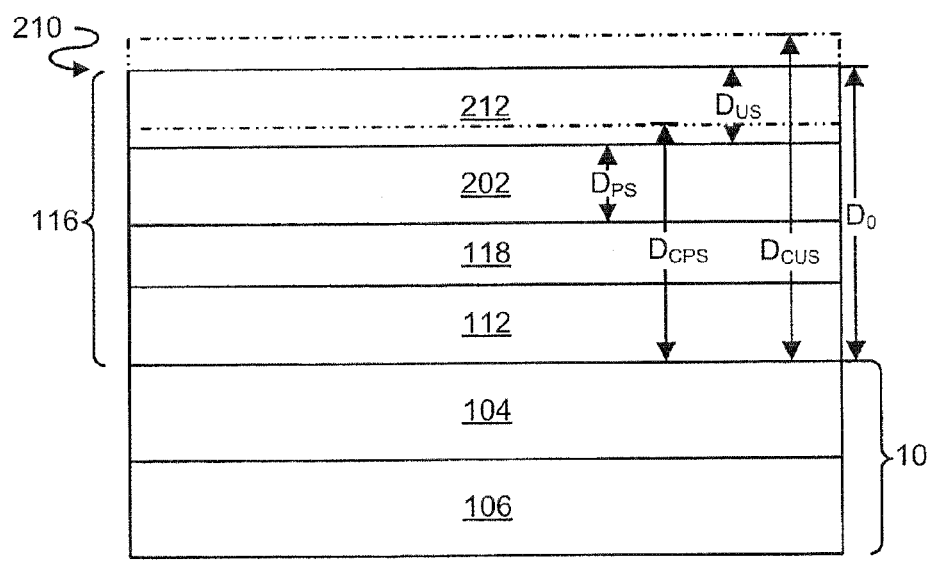

FIG. 2B illustrates semiconductor structure 210, which includes semiconductor structure 200 of FIG. 2A and an ultimate sublayer 212 grown over the penultimate sublayer 202.

Ultimate sublayer 212 may have a thickness ($D_{US}$) such that the average total thickness ($D_O$) of the III-V semiconductor layer 116 is greater than the critical thickness of the adjacent, underlying penultimate sublayer 212 (i.e., such that $D_O > D_{CPS}$). In addition, ultimate sublayer 202 may have a thickness ($D_{US}$) such that the average total thickness ($D_O$) of the III-V semiconductor layer 116 is less than or equal to ultimate sublayer critical thickness ($D_{CUS}$).

The non-limiting example of FIGS. 2A and 2B illustrates III-V semiconductor layer 116 comprising four sublayers. It should be appreciated, however, that III-V semiconductor layer 116 may include two or more sublayers including, for example, penultimate sublayer 202 and ultimate sublayer 212.

In addition, growing the two or more sublayers may utilize two or more different sets of growth conditions, such that a rate of incorporation of a group III element (e.g., indium) into a growth surface of a sublayer being grown is substantially equal to a rate at which the group III element has been incorporated into a growth surface of an adjacent, underlying sublayer, such that the concentration of the group III element in the III-V semiconductor layer (e.g., InGaN) is substantially constant across a thickness of the III-V semiconductor layer.

The methods for selecting the two or more different sets of growth conditions, such that a rate of incorporation of a group III element (e.g., indium) into a growth surface of sublayer being grown is substantially equal to a rate at which the group III element has been previously incorporated into a growth surface of an adjacent, underlying sublayer, such that the composition of the III-V semiconductor layer is substantially constant, have been described herein and may include at least one of reducing the incoming flux of the group III element into the growth surface, and increasing the desorption flux of the group III element from the growth surface, as discussed herein.

Additional sublayers of the III-V semiconductor layer may be grown to further increase the thickness of the layer while substantially maintaining a uniform composition through an entire thickness of the III-V semiconductor layer. In addition, utilizing the embodiments of the invention to grow additional sublayers may enable the formation of thicker III-V semiconductor layers (e.g., InGaN layers) free of strain relaxation and associated defects, relative to at least some previously known methods.

Non-limiting examples are now described to further illustrate embodiments of the invention. It should be understood that, in the following examples, parameters (e.g., materials, structures, etc.) are for illustrative purposes only, and do not limit embodiments of the present invention.

Embodiments of methods and structures of the present invention may be used for epitaxially growing III-V semiconductor layers including, for example, indium gallium nitride layers. The methods and structures allow for the growth of III-V semiconductor layers with substantially uniform indium concentrations, free of strain relaxation and the associated defects.

Figure 5A:
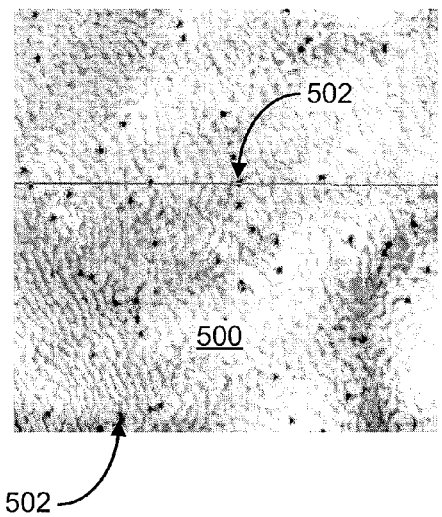
FIGS. 5A and 5B illustrate experimental results from previously known methods for growing InGaN layers.
Figure 5B:
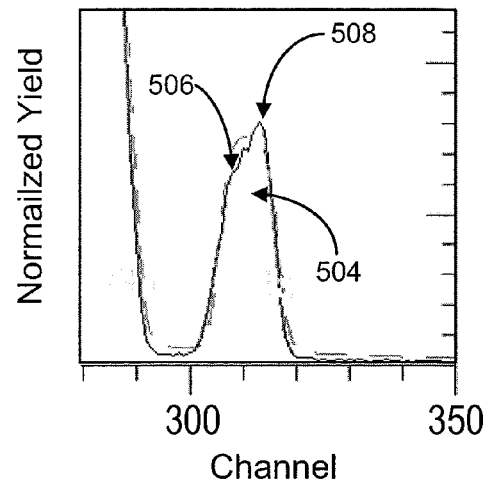

FIGS. 5A and 5B illustrate indium gallium nitride layers grown by previously known methods different from those of the current invention. FIG. 5A illustrates an atomic force microscopy scan (AFM) of the growth surface 500 of an InGaN layer. In this present example, the InGaN layer is not grown utilizing embodiments of the invention, but rather using a single set of growth conditions held constant during the entire time period over which the InGaN layer is grown. As is evident from the AFM image of FIG. 5A, the InGaN growth surface 500 produced using a single set of growth conditions includes a relatively rough surface, which includes a plurality of surface pits 502. As described herein, the rough surface may be detrimental to the formation of devices using such an InGaN layer.

In addition, FIG. 5B illustrates data produced by Ruther backscattering spectrometry (RBS), which illustrates the composition of the InGaN layer. As evident in FIG. 5B, peak 504 represents the composition of the layer of InGaN, and it is clear that the composition of the layer changes from point 506 to point 508, which indicates an increase in the concentration of indium in the layer, which may be due to strain relaxation and a subsequent increase in indium incorporation associated with such strain relaxation.

Figure 5C:
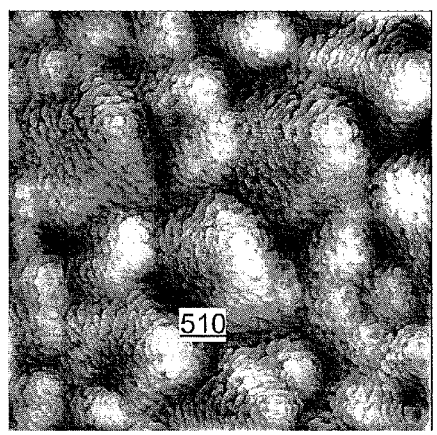
FIGS. 5C and 5D illustrate experimental results from indium gallium nitride layers grown using embodiments of the invention.
Figure 5D:
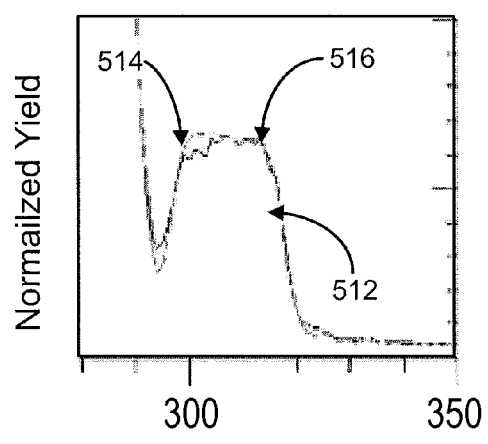

In contrast, FIGS. 5C and 5D illustrate indium gallium nitride layers grown using embodiments of the invention. Briefly, the structure may be formed as described below with reference to FIGS. 1A-1C. Substrate 106 may comprise sapphire, and semiconductor layer 104 may comprise GaN grown utilizing MOCVD methods. The initial, first InGaN sublayer 112 may be grown using MOCVD at a temperature between about 750° C. and about 850° C. at a reactor pressure of between about 700 and about 800 Torr utilizing an indium precursor trimethlyindium (TMI) as a source of indium. During the initial InGaN sublayer growth, the TMI flow rate may be between about 70 and about 90 cc per minute with a TMI bubbler temperature of about 20° C.

The following, second InGaN sublayer 118 may also be grown using MOCVD at a temperature between about 750° C. and about 850° C. at a reactor pressure between about 700 and about 800 Torr utilizing the indium precursor TMI as the source of the indium. During the following, second InGaN sublayer growth, the TMI flow rate may be reduced to between about 50 and about 70 cc per minute with a TMI bubbler temperature of about 20° C. The reduction rate in the TMI flow rate may be between about 0.5 cc and about 1 cc per minute. Utilizing such growth methods, the InGaN layer 116 produced may have an indium concentration greater than approximately 5% and a thickness greater than approximately 200 nm. In some embodiments, the InGaN layer produced may have an indium composition greater than approximately 8% and a thickness greater than approximately 150 nm.

Referring to the AFM image of FIG. 5C, it is evident that the InGaN growth surface 510 of the InGaN layer grown utilizing embodiments of the invention is smoother and relatively free of surface pits compared to the InGaN layer of FIGS. 5A and 5B. In addition, FIG. 5D illustrates data produced by RBS from an InGaN layer grown utilizing the embodiments of the invention. As evident in FIG. 5D, peak 512 represents the composition of the layer of InGaN, and it is clear that the composition of the layer remains substantially unchanged from point 514 to point 516, which indicates a uniform indium concentration. Therefore the InGaN layers produced utilizing the embodiments of the invention may be relatively more suitable for device formation relative to InGaN layers formed by at least some previously known methods.

The embodiments of the invention described above do not limit the scope the invention, since these embodiments are merely examples of embodiments of the invention, which is defined by the scope of the appended claims and their legal equivalents. Any equivalent embodiments are intended to be within the scope of this invention. Indeed, various modifications of the invention, in addition to those shown and described herein, such as alternate useful combinations of the elements described, will become apparent to those skilled in the art from the description. Such modifications are also intended to fall within the scope of the appended claims.

What is claimed is:

1. A method of forming a semiconductor structure comprising a III-V semiconductor layer, the method comprising:
   growing a III-V semiconductor layer, comprising:
      growing a first III-V semiconductor sublayer using a first set of growth conditions; and
      growing at least a second III-V semiconductor sublayer over the first III-V semiconductor sublayer using a second set of growth conditions different from the first set of growth conditions, the first III-V semiconductor sublayer and the at least a second III-V semiconductor sublayer forming the III-V semiconductor layer;
   forming the III-V semiconductor layer to have an average total thickness greater than a critical thickness of the first III-V semiconductor layer and less than a critical thickness of the second III-V semiconductor sublayer; and
   selecting the first set of growth conditions and the second set of growth conditions such that a net rate of incorporation of a group III element into a growth surface of the first III-V semiconductor sublayer is at least substantially equal to a net rate of incorporation of the group III element into a growth surface of the at least a second III-V semiconductor sublayer such that a composition of the III-V semiconductor layer is at least substantially constant across the average total thickness of the III-V semiconductor layer.

2. The method of claim 1, wherein selecting the first set of growth conditions and the second set of growth conditions further comprises reducing an incoming flux of the group III element into the growth surface of the at least a second III-V semiconductor layer relative to an incoming flux of the group III element into the growth surface of the first III-V semiconductor layer.

3. The method of claim 2, wherein reducing the incoming flux of the group III element into the growth surface of the at least a second III-V semiconductor layer relative to the incoming flux of the group III element into the growth surface of the first III-V semiconductor layer further comprises at least one of decreasing a partial pressure of a group III precursor, reducing a reactor pressure, reducing a precursor flow rate, reducing a ratio of the group III precursor to an alkyl, increasing a group V precursor flow rate and increasing an inert gas flow rate.

4. The method of claim 1, wherein selecting the first set of growth conditions and the second set of growth conditions further comprises increasing a desorption flux of the group III element from the growth surface of the at least a second III-V semiconductor layer relative to a desorption flux of the group III element into the growth surface of the first III-V semiconductor layer.

5. The method of claim 4, wherein increasing the desorption flux of the group III element from the growth surface of the at least a second III-V semiconductor layer relative to the desorption flux of the group III element into the growth surface of the first III-V semiconductor layer further comprises at least one of increasing a substrate growth temperature, decreasing a reactor growth pressure, decreasing a diffusion boundary layer thickness, and increasing a substrate rotation speed.

6. The method of claim 1, further comprising selecting the first set of growth conditions and the second set of growth conditions such that the III-V semiconductor layer is substantially free of strain relaxation.

7. The method of claim 1, further comprising selecting the III-V semiconductor layer to comprise a layer of indium gallium nitride (InGaN).

8. The method of claim 1, further comprising selecting the group III element to comprise indium.

9. A method of growing an indium gallium nitride (InGaN) layer comprising:

growing a first InGaN sublayer utilizing a first set of growth conditions to a first thickness less than or equal to a critical thickness of the first InGaN sublayer;

growing a second InGaN sublayer utilizing a different, second set of growth conditions such that an average thickness of the InGaN layer is greater than the critical thickness of the first InGaN sublayer and less than or equal to a critical thickness of the second InGaN sublayer; and selecting the different, second set of growth conditions to comprise at least one of a decreased flow rate of an indium precursor relative to a flow rate of the indium precursor in the first set of growth conditions, and an increased reactor growth temperature relative to the a reactor growth temperature in the first set of growth conditions, such that a concentration of indium in the InGaN layer is at least substantially constant across the average thickness of the InGaN layer.

10. The method of claim 9, further comprising selecting the different, second set of growth conditions such that the InGaN layer is at least substantially free of strain relaxation.

11. The method of claim 9, further comprising;
growing at least one additional InGaN sublayer on the second InGaN sublayer utilizing at least one additional set of growth conditions; and
selecting the at least one additional set of growth conditions such that the concentration of indium in the InGaN layer is substantially constant across the average thickness of the InGaN layer and the InGaN layer is substantially free of strain relaxation.

12. The method of claim 9, wherein selecting the different, second set of growth conditions further comprises decreasing a flow rate of an indium precursor by approximately about 5 sccm per minute or less while growing the second InGaN sublayer.

13. The method of claim 9, wherein selecting the different, second set of growth conditions further comprises increasing a reactor growth temperature at a rate of approximately 10° C. per minute or less while growing the second InGaN sublayer.

* * * * *